United States Patent
Lu et al.

(10) Patent No.: US 8,010,304 B2
(45) Date of Patent: Aug. 30, 2011

(54) APPARATUS AND METHOD FOR MEASURING ACTIVE AND REACTIVE POWERS

(75) Inventors: Xiuhong Lu, Beijing (CN); Gabriel Antonesei, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 339 days.

(21) Appl. No.: 12/335,030

(22) Filed: Dec. 15, 2008

(65) Prior Publication Data

US 2010/0088049 A1    Apr. 8, 2010

Related U.S. Application Data

(60) Provisional application No. 61/102,464, filed on Oct. 3, 2008.

(51) Int. Cl.
G01R 21/00    (2006.01)
G06F 17/00    (2006.01)
(52) U.S. Cl. .......... 702/60; 702/64; 702/197; 324/76.44
(58) Field of Classification Search .............. 702/60, 702/61, 64, 190, 197
See application file for complete search history.

(56) References Cited

U.S. PATENT DOCUMENTS 3,984,771 A * 10/1976 Nossen et al. ............. 324/76.82
4,878,185 A    10/1989 Brand et al.
5,483,153 A    1/1996 Leeb et al.
2005/0096879 A1 * 5/2005 Waite et al. ................... 702/189
2005/0159929 A1 * 7/2005 Overby et al. ................ 702/189

OTHER PUBLICATIONS

Moreira, et al., "Virtual Instrumentation Applied to the Implementation of IEEE STD 1459-2000 Power Definitions", Power Electr5onics Specialists Conference, 2005. Psc 2005. ISBN 978-0-7803-9033-1, 5 pages.
Cataliotti, et al., "A Time-Domain Strategy for the Measurement of IEEE STD 1459-2000 Power Quantities in Nonsinusoidal Three-Phase and Single-Phase Systems" IEEE Transactions on Power Delivery, IEEE Service Center, New York, NY, US, vol. 23, No. 4 Oct. 1, 2008 ISSN: 0885-8977., 11 pages.
A. Thari and A. Draou, "Design of a Simple Measuring Technique of the Instantaneous Power in Three Phase System". Journal of Electrical Engineering, vol. 56, No. 7-8, 2005, pp. 221-224, XP002562903.
Matsui et al., "A Simple Harmonic Meter Using Phase Locked Loop", Proceedings of the 24th Annual Conference of the IEEE (1998).
International Preliminary Report on Patentability for PCT/US09/59352, mailed on Apr. 14, 2011.

* cited by examiner

*Primary Examiner* — Hal Wachsman
(74) *Attorney, Agent, or Firm* — Kenyon & Kenyon LLP

(57) ABSTRACT

A method for measuring active power of alternating current (AC) using a digital phase-locked loop (DPLL) includes the steps of (1) generating via the DPLL a pair of substantially mutually orthogonal sinusoid signals in response to an input voltage data signal, (2) mixing a first sinusoid signal of the pair with a current data signal of the alternating current via a first low-pass filter, (3) mixing the first sinusoid signal of the pair with a voltage signal of the alternating current via a second low-pass filter, and (4) computing an active power of the alternating current based on an output from the first low-pass filter and an output from the second low-pass filter.

31 Claims, 5 Drawing Sheets

APPARATUS AND METHOD FOR MEASURING ACTIVE AND REACTIVE POWERS

CROSS-REFERENCE TO RELATED APPLICATIONS

This application claims priority to U.S. Provisional Patent Application No. 61/102,464, filed Oct. 3, 2008, entitled "Method to Measure Active and Reactive Fundamental Powers in Energy Metering Using Mixed Signal," which is herein incorporated by reference in its entirety.

FIELD OF THE INVENTION

The present invention is generally directed to a device and method for measuring the active and reactive powers of an electrical power system. In particular, the present invention is directed to a device and method for measuring the active and reactive powers at a fundamental frequency or at harmonic frequencies using a digital phase-locked loop (DPLL).

BACKGROUND INFORMATION

Electricity is commonly delivered from electricity suppliers to consumers in the form of alternating current (AC) at a certain fundamental frequency, e.g., 60 Hz in the U.S. The consumption of electricity, e.g., three-phase AC, is commonly measured by power meters. It is known that when the load of an power supply system includes non-linear components, the electrical power supply may include harmonic frequencies other than the fundamental frequency. Additionally, when the load is not purely resistive, the waveform of voltage V may lead or lag the waveform of current I in time or have a phase offset in the frequency domain.

Electrical power may include three components: apparent power ($P_{app}$), active power ($P_{act}$), and reactive power ($P_{react}$). The apparent power $P_{app}$ may be defined as the product of magnitudes of voltage V and current I, i.e., P=V×I. The active power $P_{act}$ may be defined as the capacity of the load at a particular time or the energy that flows from power source to the load. The reactive power $P_{reactive}$ may be defined as the energy that is bounced back from the load to the source. If the phase offset between current and voltage in frequency is $\phi$, then $P_{act}=P_{app}*|Cos(\phi)|$ and $P_{react}=P_{app}*|Sin(\phi)|$.

When the number of non-linear loads, e.g., switching power supplies, increases, a larger amount of harmonic content may be present in the power system. These harmonics may limit the effectiveness of the power system to deliver electrical power from a source to a load. The combination of digital signal processing (DSP) and high performance analog to digital converters (ADCs) at low prices provides electrical power suppliers with new options for improving and optimizing electrical power meters. The owner suppliers may want to know how much electrical power is delivered not only at the fundamental frequency but also at harmonic frequencies.

Current techniques for computing $P_{act}$ and $P_{react}$ at a fundamental frequency are mostly based on Digital Fourier Transform (DFT) and band-pass filters. These methods and devices may suffer longer calculation time. A previous publication "A Simple Harmonic Meter Using Phase Locked Loop" by Matsui et al., Proceedings of the 24th Annual Conference of the IEEE (1998), shows a method of using PLL to detect power of various harmonics in a single voltage signal. The Matsui's method always locks to the carrier of fundament frequency and needs another feedback loop for adjusting the time delay circuit for phase shift. Most importantly, the Matsui's method does not show how to use PLL to compute active and reactive powers, which requires not only the voltage signal and current signal, but also the phase offset between these two signals.

DETAILED DESCRIPTION OF EXAMPLE EMBODIMENTS

Figure 1:
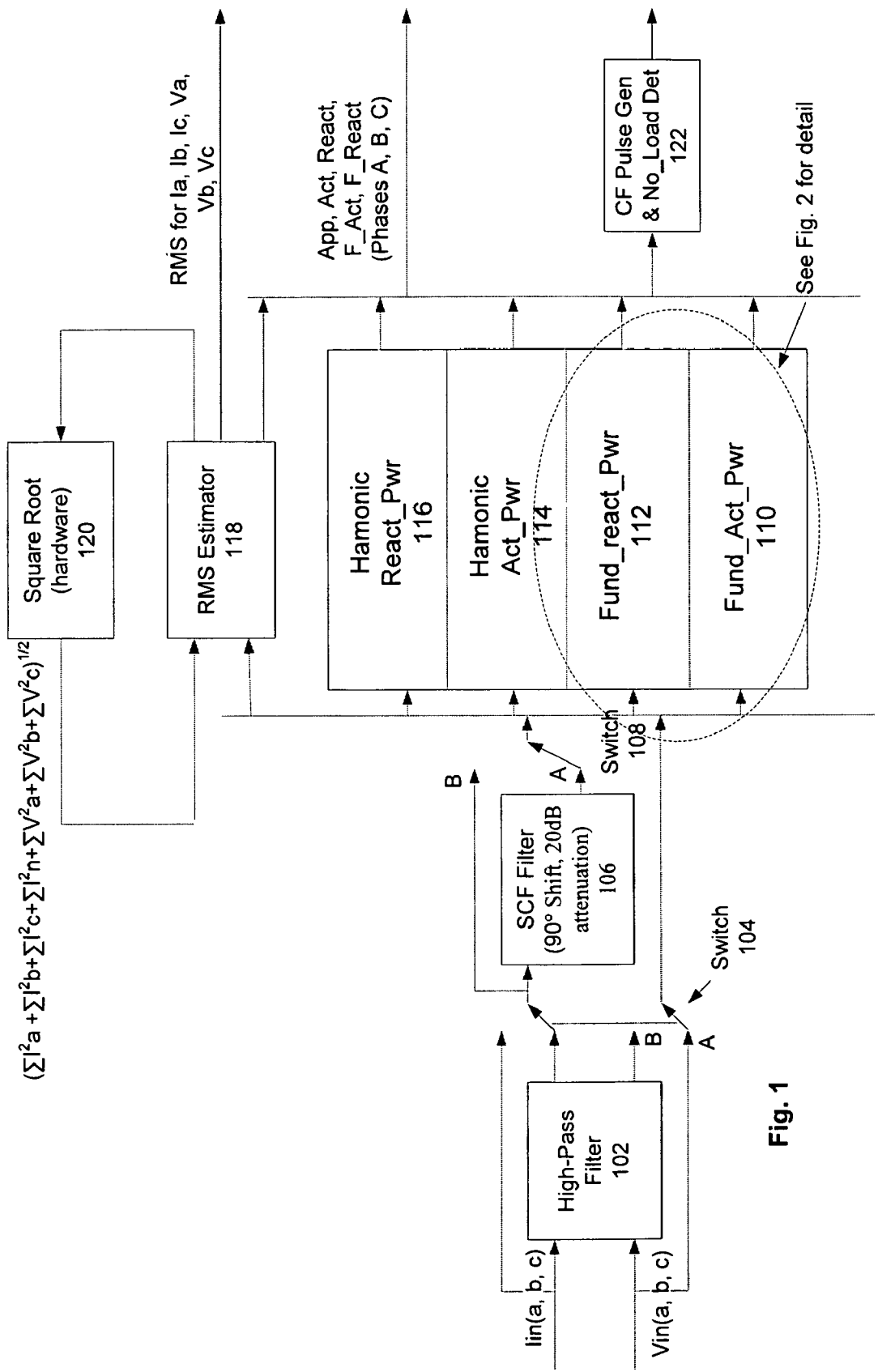
FIG. 1 shows an example top-level diagram of the system for measuring the active and reactive powers according to one example embodiment of the present invention.

In view of current techniques for measuring power consumptions, there is a need for computing the active and reactive powers simultaneously at the fundamental frequency or at a plurality of harmonic frequencies in near real time.

In one example embodiment of the present invention, a digital phase-locked loop (DPLL) may be used to lock in a fundamental frequency, e.g., 60 Hz. Two references signals that are orthogonal to each other, e.g., I-phase and Q-phase signals, at the fundamental frequency may be generated from the DPLL. The orthogonal reference signals may have unit amplitude. The amplitude of the input voltage $V_{in}$ and input current $I_{in}$ at the fundamental frequency as well as the phase shift between $V_{in}$ and $I_{in}$ may be calculated by correlating $V_{in}$ and $I_{in}$ with reference signals. Low pass filters may be used to reject components that do not contribute to the DC component. The $P_{act}$ and $P_{react}$ at the fundamental frequency may be calculated by multiplying the voltage amplitude at the fundamental frequency with a current $I_{in}$ vector of orthogonal phase components.

In another example embodiment of the present invention, a DPLL may be used to lock in a particular harmonic frequency. Two orthogonal reference signals at the harmonic frequency may be generated from the DPLL. The orthogonal reference signals may have a unit amplitude. The amplitude of the input voltage $V_{in}$ and input current $I_{in}$ at the harmonic frequency as well as the phase shift between $V_{in}$ and $I_{in}$ at the harmonic frequency may be calculated by correlating $V_{in}$ and $I_{in}$ with reference signals. Low pass filters may be used to reject components that do not contribute to the DC component. The $P_{act}$ and $P_{react}$ at the harmonic frequency may be calculated by multiplying the voltage amplitude at the harmonic frequency with a current $I_{in}$ vector of orthogonal phase components.

In one example embodiment of the present invention, a DPLL may include one multiplier, one loop filter, and one numerically-controlled oscillator (NCO) in a feedback loop. The NCO may further include one accumulator and a sinusoid look-up-table (LUT). An input frequency tuning word may be integrated with the accumulator whose output may be a phase word. The phase word may be used as an index to the LUT for searching amplitude values of sinusoid waves. The multiplier takes inputs from an input signal and a feedback signal from the NCO, and multiplies them for detecting the phase difference between the input signal and the feedback signal as conventionally known. The product of the input signal and the feedback signal is fed into the loop filter, which may be a low-pass filter with, e.g., a 3 db bandwidth much lower than the line frequency of an input voltage signal or an input current signal. The output of the loop filter may include the phase difference (or phase error) which may be integrated in the accumulator. The NCO may take the accumulator output as frequency tuning word to generate unit amplitude orthogonal cosine and sine signals based on a sine or cosine table. One of the orthogonal signals, e.g., the cosine signal, may be fed back into the multiplier for phase detection.

The input voltage signal and current signal to a measuring device or power meter may include components at different harmonic frequencies and may be formulated as:

$$V_{in}=V_1 \cos(tW_1+\theta_1)+V_2 \cos(tW_2+\theta_2)+\ldots+V_n \cos(tW_n+\theta_n),$$

$$I_{in}=I_1 \cos(tW_1+\phi_1)+I_2 \cos(tW_2+\phi_2)+\ldots+I_n \cos(tW_n+\phi_n),$$

where the $V_{in}$ and $I_{in}$ are the input voltage and current signals, $V_i$ and $I_i$, $i=1, 2, \ldots, n$ are the amplitudes of the $i^{th}$ harmonic voltage and current, $W_i$, $i=1, 2, \ldots, n$ are the $i^{th}$ harmonic frequencies, W1 is also called the fundamental frequency, $\theta_i$ and $\phi_i$, $i=1, 2, \ldots, n$ are the phases of $i^{th}$ harmonic voltage and current signals, and t represents the time. A DPLL may be used in the voltage channel to lock into the fundamental frequency $W_1$. The NCO outputs of the DPLL may include unit amplitude cosine and sine signals in the forms of: $\cos(tW_1+\theta_1+d(t))$ and $\sin(tW_1+\theta_1+d(t))$, where $d(t)$ is a small phase error caused by the DPLL. The cosine signal from the NCO outputs may have an approximate 90 degree phase difference from the input fundamental voltage signal (assuming that the input fundamental voltage signal has zero DC component). The input voltage signal $V_{in}$ and the feedback cosine signal may be multiplied at the multiplier:

$$\cos(tW_1+\theta_1+d(t))*(V_1 \cos(tW_1+\theta_1)+V_2 \cos(tW_2+\theta_2)+\ldots+V_n \cos(tW_n+\theta_n))=$$
$$0.5*V_1*\cos(d(t))+0.5*V_1*\cos(2tW_1+2\theta_1+d(t)+\cos(tW_1+\theta_1+d(t))*(V_2 \cos(tW_2+\theta_2)+\ldots+V_n \cos(tW_n+\theta_n))$$

Since the phase error $d(t)$ of a DPLL is usually small, i.e., close to zero, after applying a low-pass filter to the output of the multiplier, the output of the low pass filter is Result_A=$0.5*V_1*\cos(d(t))\approx0.5*V_1$.

Similarly, the multiplication of the cosine component of the NCO output and the current signal, and applying a low-pass filter may result: Result_B=$\cos(tW_1+\theta_1+d(t))*(I_1 \cos(tW_1+\theta_1)+I_2 \cos(tW_2+\theta_2)+\ldots+I_n \cos(tW_n+))=0.5*I_1*\cos(\theta_1+d(1)-\phi_1)\approx 0.5*I_1 \cos(\theta_1-\phi_1)$. The multiplication of the sine component of the NCO output and the current signal, and applying a low-pass filter may result: Result_C=$\sin(tW_1+\theta_1+d(t))*(I_1 \cos(tW_1+\theta_1)+I_2 \cos(tW_2+\theta_2)+\ldots+I_n \cos(tW_n+\theta_n))=0.5*I_1*\sin(\theta_1+d(t)-\phi_1)\approx 0.5*I_1 \sin(\theta_1-\phi_1)$. The active fundamental power may be computed by multiplying the Result_A and Result_B: $P_{act}=0.25*V_1*I_1*\cos(\theta_1-\phi_1)$ with a gain adjustment of factor of 4, and the reactive fundamental power may be computed by multiplying the Result_A and Result_C: $P_{react}=0.25*V_1*I_1*\sin(\theta_1-\phi_1)$ after a gain adjustment of factor of 4.

Above method for computing fundamental active and reactive powers may similarly be applied to the computation of active and reactive powers at harmonic frequencies, e.g., $W_i$, $i=2, \ldots, n$. A DPLL tuned to a particular harmonic frequency $W_i$ may be used to lock in the harmonic $W_i$ instead of the fundamental frequency. Using a similar computation process, the harmonic active and reactive powers are $P_{act}(W_i)=0.25*V_i*I_i*\cos(\theta_i-\phi_i)$ with a gain adjustment of factor of 4 and $P_{react}(W_i)=0.25*V_i*I_i*\sin(\theta_i-\phi_i)$ with a gain adjustment of factor of 4, respectively.

The accuracy of the active and reactive powers may depend on the phase error $d(t)$. For an accurate measurement of the active and reactive powers, it is important to keep $d(t)$ as low as possible. It is observed that variations in the amplitude of $V_1$ may affect the phase error to an extent that the phase error may degrade the accuracy of active and reactive power computation. The reason for the correlation between phase errors and voltage amplitude variations may be that the phase detection is carried out by a multiplier and a low-pass filter so that the decrease in the input voltage signal amplitudes may cause the decrease in the gain of the loop filter. To minimize the effect of voltage amplitude variations, the voltage amplitude may be estimated and compensated automatically by variable gains for any changes before the multiplier for phase detection. In one example embodiment of the present invention, the RMS (root-mean-square) value of $V_{in}$ (hereinafter referred to as $V_{inrms}$) may be estimated over a period of time. Based on $V_{inrms}$ and a reference signal $V_{ref}$, a gain correction factor of $V_{ref}/V_{inrms}$ may be applied to input signals to the DPLL. In one example embodiment of the present invention, the $V_{inrms}$ is calculated with an additional multiplier for computing the square value of Vin, a low-pass IIR (infinite impulse response) filter for averaging, and a square root extractor.

FIG. 1 shows an example top-level diagram of the system for measuring the active and reactive powers according to one example embodiment of the present invention. In one example embodiment of the present invention, the input signals are digital signals (impulses) from an analog to digital converter (ADC) with the input signals correspondingly representing input voltage and current signals. The system may include a high-pass filter 102 for removing DC term of an input, a sensor compensation filter (SCF) filter or a current sensor for measuring current 106 that may shift the input signal phase by 90 degrees, computational units for calculating fundamental active power 110, fundamental reactive power 112, harmonic active power 114 and harmonic reactive power 116, a square root extractor 120, a functional component for estimating RMS of input voltage and current signals. Each of the computational units may be implemented in a hardware arrangement or a processor encoded with the computational method.

When both switch 104 and switch 106 are at position A, the three-phase voltage input signals $V_{in}$ (a, b, c), may be fed directly into the inputs of computational units for computing fundamental active power 110, fundamental reactive power 112, harmonic active power 114, and harmonic reactive power 116. The three-phase current input signals $I_{in}$ (a, b, c) may pass through a high-pass filter 102 for removing any DC terms in the input current signals and a SCF filter for shifting the phase of the current input signals by approximately 90 degrees before being fed into computational units 110, 112, 114, and 116. An RMS estimator 118 may take inputs of input voltage signal and input current signal with a 90 degree phase shift. The RMS estimator may include a multiplier (not shown) for computing the square value of a digital signal impulse, a low-pass IIR (not shown) for computing the average of the square values of a sequence of digital signal impulses, and a square root extractor 120 for computing the square root of the average.

Computational units 110, 112 (details in the following FIG. 2) may compute the fundamental active and reactive powers. Similarly, computational units 114, 116 may compute the harmonic active and reactive powers for any harmonic frequency. The final outputs may include apparent power, fundamental active and reactive powers, harmonic active and reactive powers, and RMS values of the input voltage and current signals. A functional component 122 may take these final outputs to CF_pulse generation or load detection for generating a power bills. The CF_pulse_generation module may generate pulses whose frequency may correspond to the usage of active or reactive powers.

Figure 2:
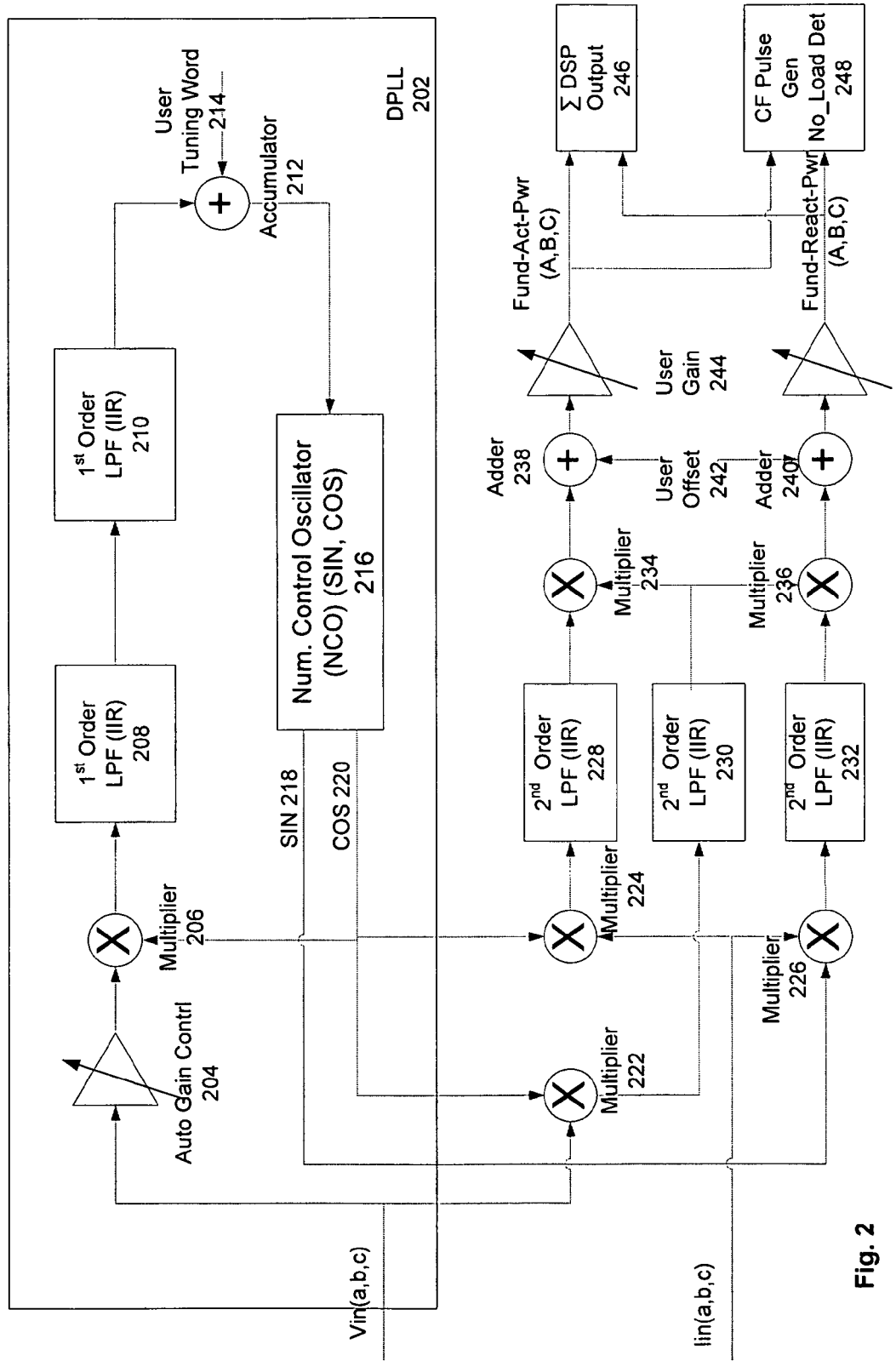
FIG. 2 shows an example component-level diagram of the system for measuring the active and reactive powers at a fundamental frequency or at harmonic frequencies using a DPLL to generate orthogonal reference signals according to one example embodiment of the present invention.

FIG. 2 shows an example component-level diagram for measuring the active and reactive powers at a fundamental frequency or at harmonic frequencies using a DPLL to generate orthogonal reference signals according to one example embodiment. The dashed line box indicates an example DPLL 202 which includes an automatic gain control (AGC) 204, a multiplier 206, two IIR low-pass filters 208, 210, an accumulator 212 with a user-specified tuning word input 214, and a numerically-controlled oscillator (NCO) 216.

The ACG 204 may take input signals, e.g., input voltage signals $V_{in}$ (a, b, c), and automatically adjust their amplitudes based on $V_{inrms}$ and $V_{ref}$ as explained above. A voltage channel compensations for cases where voltage amplitudes are not at full-scale may be needed since the performance of the DPLL may depend on the amplitudes. As in a conventional DPLL, the multiplier 206 acts as a detector for phase errors. In one example embodiment as shown in FIG. 2, the first IIR low-pass filter 208 may be characterized in z-transform domain, e.g., by a transfer function of $$LPF(z) = \frac{2^{-7}}{1-(1-2^7)*z^{-1}},$$

and the second IIR low-pass filter 210 may be characterized, e.g., by $$LPF(z) = \frac{1+2^{-9}z^{-1}}{1-z^{-1}}.$$

The multiplier 206 in combination with the first IIR low-pass filter 208 and the second IIR low-pass filter 210 may detect the phase offset in the input signal. The error signals may be added together at the phase accumulator 212 which may be tuned by a user specified tuning word.

Figure 3:
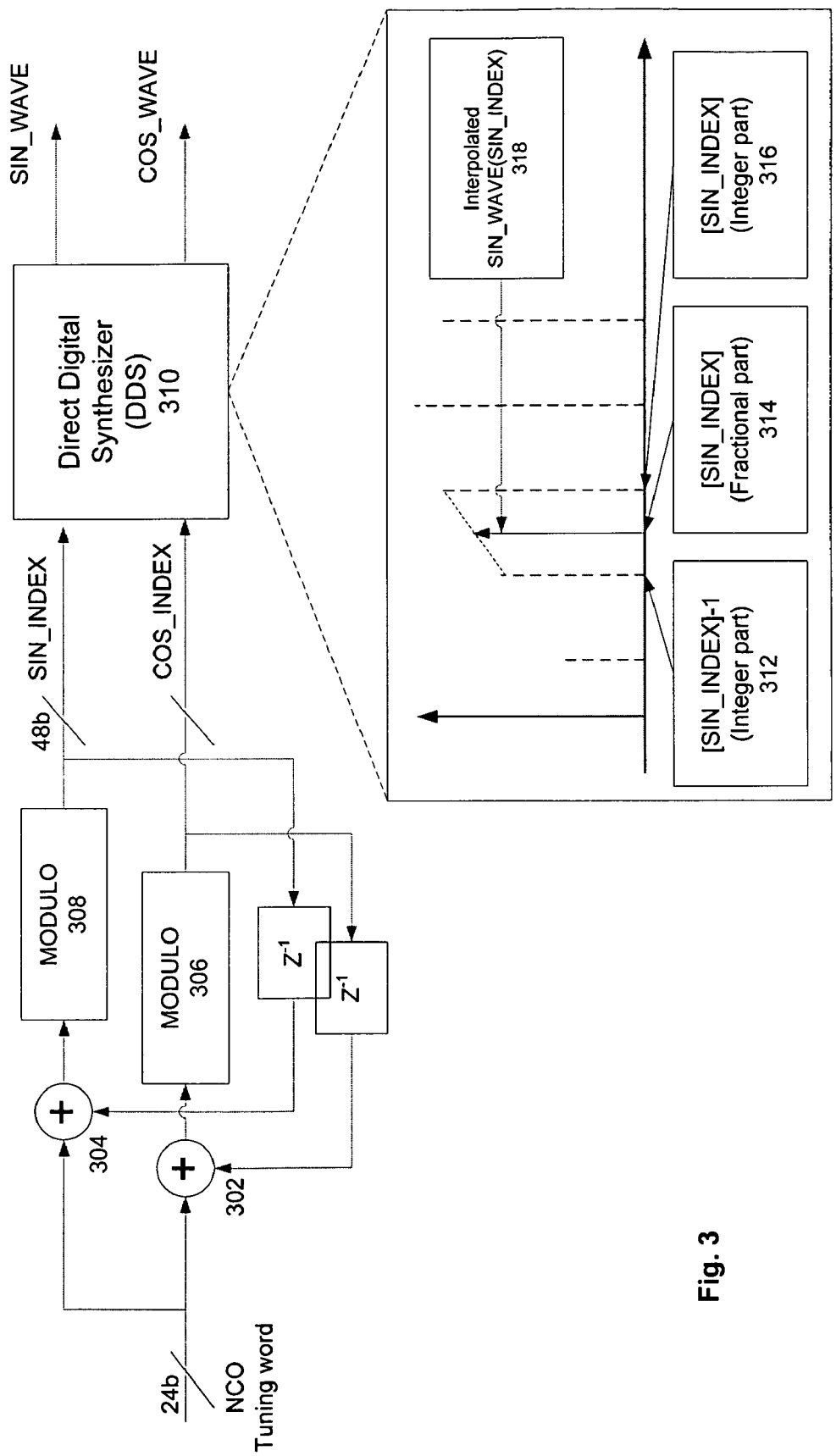
FIG. 3 shows an example numerically-controlled oscillator that includes two phase accumulators and generates orthogonal sine and cosine waves according to one example embodiment of the present invention.

Referring to FIG. 3, it shows an example numerically-controlled oscillator that includes two phase accumulators and generates orthogonal sine and cosine waves according to one example embodiment of the present invention. The phase accumulator 202 may include two accumulators 302, 304 with a first accumulator 302 for the cosine signal components and a second accumulator 304 for orthogonal sine signal components. In practice, both the cosine and the sine components may be accumulated on the same register word. However, the cosine component may have a different initial position from the sine component so that the cosine waveform is 90 degree out of phase from the sine waveform. The MODULO functional blocks 306, 308 may include operations that find the remainder of a division of one number over another. The MODULO 306, 308 may prevent the generated cosine and sine indices from overflow the size of a table inside the direct digital synthesizer (DDS) 310. For example, even if the width of an index is 48 bits, the upper 24 bits may be limited to a value of 255 because of the MODULO function.

The DDS may generate cosine and sine waveforms based on the cosine and sine indices. A sine table may be stored in a memory associated with a DSP chip. For an integer index value, the signal amplitude may be found by a direct table lookup. For a fractional index value, the signal amplitude may be calculated by an approximation approach, e.g., a linear interpolation, based on the amplitudes at the integer indices before and after the fractional index. The output signals of the DDS may include both a cosine waveform and a sine waveform with approximate 90 degree phase offset. The frequency of the output signals from the DDS may be determined as $F_{out}=F_s*T/2^N$, where the $F_s$ is the DDS clock frequency, $2^N$ is the accumulator capacity with N being the word length of the accumulator, and T is the tuning word value. Therefore, the output signal frequency may be adjusted to match a fundamental frequency by changing the tuning word.

Referring back to FIG. 2, the output signals of the DDS are unit amplitude, orthogonal cosine waveform 220 and sine waveform 218 waveforms at the fundamental frequency. At multiplier 222, the input voltage signal $V_{in}$ multiplies with the cosine waveform 220 from the DDS output. At multiplier 224, the input current signal $I_{in}$ multiplies with the cosine waveform 220 from the DDS output. At multiplier 226, the input current signal $I_{in}$ multiplies with the sine waveform 220 from the DDS output. The resulting products from multipliers 224, 222, and 226 may pass through second order IIR low-pass filters 228, 230, and 232, respectively, for removing high frequency components. Further, at multiplier 234, the outputs from low-pass filters 228 and 230 may be multiplied, and at multiplier 236, the outputs from low-pass filters 232 and 230 may be multiplied. A user offset 242, e.g., a DC term that a user may use to calibrate the whole meter system, may be added to the results from multipliers 234 and 236 at an adder 238 and 240, respectively. The fundamental active and reactive powers $P_{fund\_act\_pwr}$ and $P_{fund\_react\_pwr}$ may be computed after a gain adjustment specified by the user. The $P_{fund\_act\_pwr}$ and $P_{fund\_react\_pwr}$ may be input into a DSP 246 for further processing. Alternatively, functional block 248 may detect no load or generate CF pulses.

It is understood that for the arrangement of FIG. 2, the DPLL may be applied to lock into a frequency of a current signal of the AC. Under such a situation (now shown in FIG. 2), the input to the DPLL may be derived from the current signal of the AC. The current signal may be further combined with a voltage signal of the AC for the computation of active and reactive powers of the AC in a manner similar to the example shown in FIG. 2.

Figure 4:
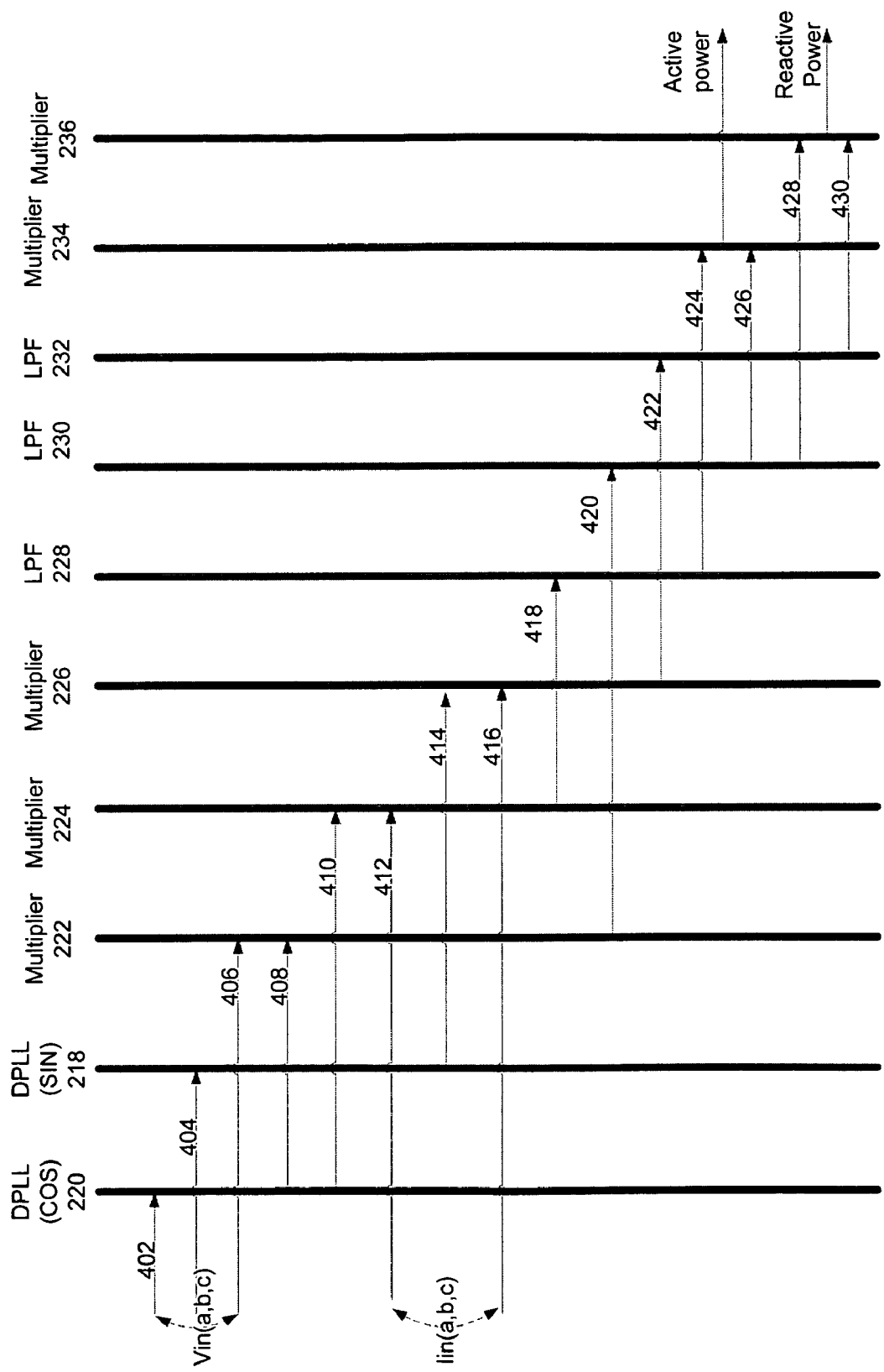
FIG. 4 shows an example cross-functional diagram for illustrating the process of calculating the active and reactive powers at a fundamental frequency or at harmonic frequencies according to one example embodiment of the present invention.

FIG. 4 shows an example cross-functional diagram illustrating the process of calculating the active and reactive powers at a fundamental frequency or at harmonic frequencies according to one example embodiment of the present invention. Input voltage signal $V_{in}$ may be fed into a DPLL which is tuned to a fundamental frequency, e.g., 60 Hz. At 402 and 404, the DPLL as shown in FIGS. 2 and 3 may generate orthogonal, unit amplitude cosine and sine waveforms. At 406 and 408, the $V_{in}$ may be multiplied with the cosine signal from the DDS at the multiplier 222, and then pass through a low-pass filter 230 at step 420. At 410 and 412, the $I_{in}$ may be multiplied with the cosine signal from the DDS at the multiplier 224, and then pass through a low-pass filter 228 at step 418. At 414 and 416, the $I_{in}$ may be multiplied with the sine signal from the DDS at the multiplier 226, and then pass through a low-pass filter 232 at step 422. At 424 and 426, the outputs from the low-pass filters 228 and 230 may be multiplied at multiplier 234 for computing the fundamental active power. At 428 and 430, the outputs from the low-pass filters 230 and 232 may be multiplied at multiplier 236 for computing the fundamental reactive power.

In an alternative embodiment of the present invention, harmonic active and reactive powers may be calculated using similar steps. For computing harmonic powers, the DPLL may be tuned so that it locks the input signals to a harmonic frequency. Then harmonic active and reactive powers may be calculated in similar steps as those for fundamental active and reactive powers.

Figure 5:
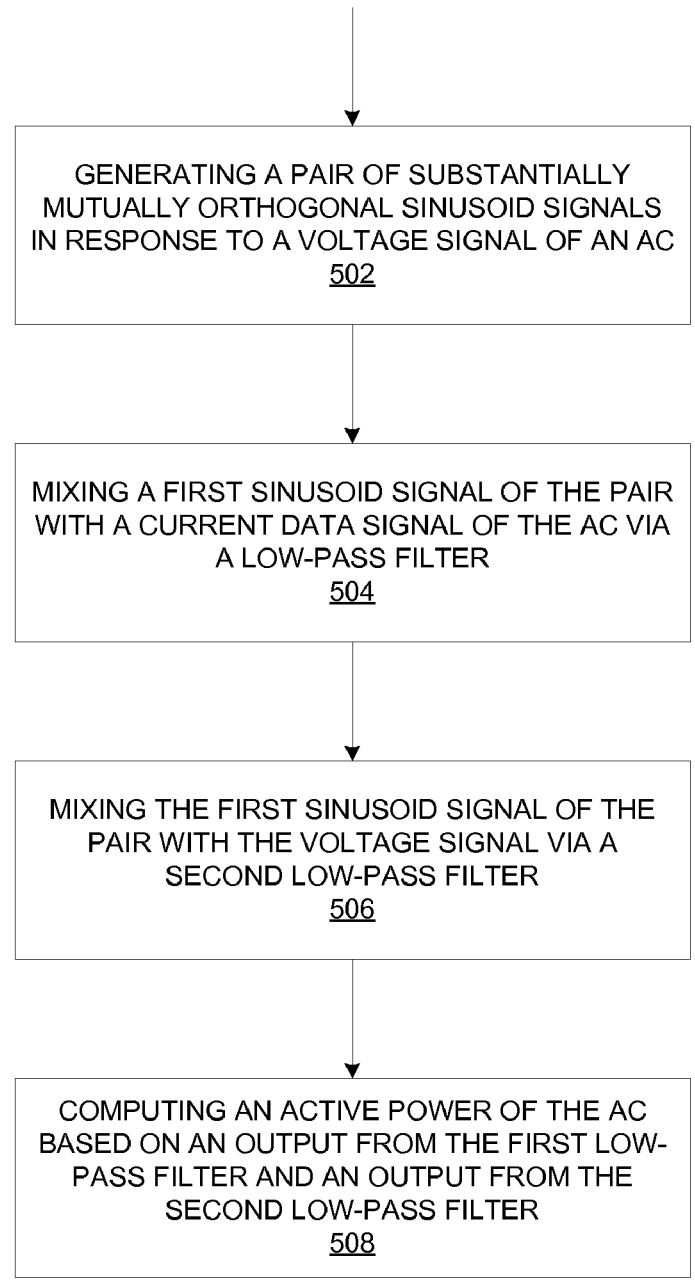
FIG. 5 shows an example method for measuring active power according to one example embodiment of the present invention.

FIG. 5 shows an example method for measuring active power according to one example embodiment of the present invention. At 502, an input voltage signal of an AC may be fed into a DPLL to generate a pair of substantially mutually orthogonal sinusoid signals. At 504, a first low-pass filter may be used to mix a first sinusoid signal of the pair with a current data of the AC. At 506, a second low-pass filter may be used to mix the first sinusoid signal of the pair with the input voltage signal. At 508, an active power of the AC input may be computed based on an output from the first low-pass filter and an output from the second low-pass filter.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A method for measuring active power of alternating current (AC) with respect to a frequency, comprising:
generating via a digital phase-locked loop (DPLL) a pair of substantially mutually orthogonal sinusoid signals in response to a voltage data signal of the alternating current;
mixing a first sinusoid signal of the pair with a current data signal of the alternating current via a first low-pass filter;
mixing the first sinusoid signal of the pair with the voltage data signal of the alternating current via a second low-pass filter; and
computing an active power of the alternating current based on an output from the first low-pass filter and an output from the second low-pass filter.

2. The method of claim 1, further comprising:
mixing a second sinusoid signal of the pair with a current data signal of the alternating current via a third low-pass filter;
computing a reactive power of the alternating current based on an output from the third low-pass filter and the output from the second low-pass filter.

3. The method of claim 2, wherein each of the first sinusoid signal and the second sinusoid signal is tuned to substantially approximate to the frequency using a user-specified tuning word.

4. The method of claim 2, wherein an index of the first sinusoid signal and an index of the second sinusoid signal are accumulated in a register, and wherein the starting position in the register for the first sinusoid signal is different from a starting position in the register for the second sinusoid signal.

5. The method of claim 2, wherein each of the first low-pass filter, the second low-pass filter, and the third low-pass filter is a second-order infinite impulse response (IIR) filter.

6. The method of claim 1, wherein the DPLL further includes a tuning word, based on which the DPLL is tuned to the frequency.

7. The method of claim 1, wherein the frequency is a fundamental frequency of the alternating current.

8. The method of claim 1, wherein the frequency is one of 50 Hz and 60 Hz.

9. The method of claim 1, wherein voltage data signal is compensated by an automatic gain control (AGC) before being inputted into the DPLL.

10. A machine-readable non-transitory storage medium having stored thereon instructions adapted to be executed by a processor to perform a method for measuring active power of alternating current (AC) with respect to a frequency, comprising:
generating via a digital phase-locked loop (DPLL) a pair of substantially mutually orthogonal sinusoid signals in response to a tuning word and an input voltage data signal;
mixing a first sinusoid signal of the pair with a current data signal of the alternating current via a first low-pass filter;
mixing the first sinusoid signal of the pair with a voltage data signal of the alternating current via a second low-pass filter; and
computing an active power of the alternating current based on an output from the first low-pass filter and an output from the second low-pass filter.

11. A machine-readable non-transitory storage medium of claim 10, further comprising:
mixing a second sinusoid signal of the pair with the current data signal of the alternating current via a third low-pass filter;
computing a reactive power of the alternating current based on an output from the third low-pass filter and the output from the second low-pass filter.

12. A machine-readable non-transitory storage medium of claim 11, wherein each of the first sinusoid signal and the second sinusoid signal is tuned to substantially approximate to the frequency using a user-specified tuning word.

13. A machine-readable non-transitory storage medium of claim 11, wherein an index of the first sinusoid signal and an index of the second sinusoid signal are accumulated in a register, and wherein the starting position in the register for the first sinusoid signal is different from a starting position in the register for the second sinusoid signal.

14. A machine-readable non-transitory storage medium of claim 11, wherein each of the first low-pass filter, the second low-pass filter, and the third low-pass filter is a second-order infinite impulse response (IIR) filter.

15. A machine-readable non-transitory storage medium of claim 10, wherein the DPLL further includes a tuning word, based on which the DPLL is tuned to the frequency.

16. A machine-readable non-transitory storage medium of claim 10, wherein the frequency is a fundamental frequency of the AC.

17. A machine-readable non-transitory storage medium of claim 10, wherein the frequency is one of 50 Hz and 60 Hz.

18. A machine-readable non-transitory storage medium of claim 10, wherein voltage data signal is compensated by an automatic gain control (AGC) before being inputted into the DPLL.

19. A device for measuring active power of alternating current (AC) with respect to a frequency, the AC being represented by a voltage data signal and a current data signal, comprising:
- a digital phase-locked loop (DPLL) having inputs of the voltage data signal, and outputs of a pair of substantially mutually orthogonal sinusoid signals;
- a first low-pass filter for mixing a first sinusoid signal of the pair with the current data signal of the alternating current;
- a second low-pass filter for mixing the first sinusoid signal of the pair with the voltage data signal of the alternating current; and
- a first multiplier for mixing an output from the first low-pass filter and an output from the second low-pass filter.

20. The device of claim 19, further comprising:
- a third low-pass filter for mixing a second sinusoid signal of the pair with the current data signal of the alternating current; and
- a second multiplier for mixing an output from the third low-pass filter and the output from the second low-pass filter.

21. The device of claim 20, wherein each of the first sinusoid signal and the second sinusoid signal is tuned to substantially approximate to the frequency using a user-specified tuning word.

22. The device of claim 20, wherein an index of the first sinusoid signal and an index of the second sinusoid signal are accumulated on a register, and wherein the starting position in the register for the first sinusoid signal is different from a starting position in the register for the second sinusoid signal.

23. The device of claim 20, wherein each of the first low-pass filter, the second low-pass filter, and the third low-pass filter is a second-order infinite impulse response (IIR) filter.

24. The device of claim 19, wherein the DPLL further includes a tuning word, based on which the DPLL is tuned to the frequency.

25. The device of claim 19, wherein the frequency is a fundamental frequency of the AC.

26. The device of claim 19, wherein the frequency is one of 50 Hz and 60 Hz.

27. The device of claim 19, wherein voltage data signal is compensated by an automatic gain control (AGC) before being inputted into the DPLL.

28. A method for measuring active power of alternating current (AC) with respect to a frequency, comprising:
- generating via a digital phase-locked loop (DPLL) a pair of substantially mutually orthogonal sinusoid signals in response to a current data signal of the alternating current;
- mixing a first sinusoid signal of the pair with a voltage data signal of the alternating current via a first low-pass filter;
- mixing the first sinusoid signal of the pair with the current data signal of the alternating current via a second low-pass filter; and
- computing an active power of the alternating current based on an output from the first low-pass filter and an output from the second low-pass filter.

29. The method of claim 28, further comprising:
- mixing a second sinusoid signal of the pair with a voltage data signal of the alternating current via a third low-pass filter;
- computing a reactive power of the alternating current based on an output from the third low-pass filter and the output from the second low-pass filter.

30. A device for measuring active power of alternating current (AC) with respect to a frequency, the AC being represented by a voltage data signal and a current data signal, comprising:
- a digital phase-locked loop (DPLL) having inputs of the current data signal, and outputs of a pair of substantially mutually orthogonal sinusoid signals;
- a first low-pass filter for mixing a first sinusoid signal of the pair with the voltage data signal of the alternating current;
- a second low-pass filter for mixing the first sinusoid signal of the pair with the current data signal of the alternating current; and
- a first multiplier for mixing an output from the first low-pass filter and an output from the second low-pass filter.

31. The device of claim 30, further comprising:
- a third low-pass filter for mixing a second sinusoid signal of the pair with the voltage data signal of the alternating current; and
- a second multiplier for mixing an output from the third low-pass filter and the output from the second low-pass filter.

* * * * *